United States Patent
Yamada et al.

[11] Patent Number: 5,983,011
[45] Date of Patent: Nov. 9, 1999

[54] METHOD OF SIMULATING A PROFILE OF SPUTTER DEPOSITION WHICH COVERS A CONTACT HOLE FORMED ON A SEMICONDUCTOR WAFER

[75] Inventors: Hiroaki Yamada; Toshiyuki Ohta, both of Tokyo, Japan

[73] Assignee: NEC Corporation, Tokyo, Japan

[21] Appl. No.: 08/921,507

[22] Filed: Sep. 2, 1997

[30] Foreign Application Priority Data

Jan. 29, 1997 [JP] Japan .................................. 9-015101

[51] Int. Cl.[6] .................................................. G06F 9/455
[52] U.S. Cl. ................................................. 395/500.35
[58] Field of Search .................... 395/500, 500.34, 395/500.35, 500.36, 500.41; 204/192.15, 192.12, 298.01

[56] References Cited

U.S. PATENT DOCUMENTS

| | | | |
|---|---|---|---|
| 5,556,525 | 9/1996 | Krivokapic et al. | 204/192.12 |
| 5,733,426 | 3/1998 | Cox et al. | 204/298.01 |
| 5,815,684 | 9/1998 | Ohta et al. | 395/500 |

OTHER PUBLICATIONS

Neri, *Sputtering Magnetron Experiments and Modeling*, May 1990, p. 202.

Howell et al., *Depdendence of Orientation and Electrical Properties in Sputtered ZnO upon Deposition Conditions and Substrate*, Jul. 1988, pp. 677–680.

Bang et al., *A Multiple Target Sputter System and Enhanced Wafer Uniformity Lifetime Uniformity and Wafer Scaleability*, May 1994, pp. 2131–2134.

*Primary Examiner*—Kevin J. Teska
*Assistant Examiner*—Dan Fiul
*Attorney, Agent, or Firm*—Young & Thompson

[57] ABSTRACT

In order to simulate, using a computer, a profile of sputter deposition on a contact hole formed on a semiconductor wafer, a plurality of trajectories of particles emitted from a sputter target are calculated. One of the trajectories is directed to a first coordinate point which is included in the profile of sputter deposition and with which an amount of sputter deposition is calculated. Thereafter, a plurality of shadow judgment planes are successively defined with respect to all coordinate points, after which a check is made to determine if the above mentioned one of the plurality of trajectories crosses each of said plurality of shadow judgment planes.

9 Claims, 6 Drawing Sheets

METHOD OF SIMULATING A PROFILE OF SPUTTER DEPOSITION WHICH COVERS A CONTACT HOLE FORMED ON A SEMICONDUCTOR WAFER

BACKGROUND OF THE INVENTION

1. Field of the Invention

The present invention relates generally to a computer simulation method, and more specifically to a method of simulating a sputter deposition profile when refilling a contact hole formed on a semiconductor wafer. By way of example, the present invention finds excellent advantages when applied to a sputtered aluminum profile computer simulation.

2. Description of the Related Art

As the density of semiconductor device increases, it becomes very important to develop a technology for effectively burying or refilling a conductive material in the miniaturized contact holes.

In order to improve such a technology, Japanese Laid-open Patent Application No. 8-171549 discloses a method of simulating a profile of deposited film using axial symmetry of a contact hole. According to this related art, the portions of a sputter target, from which atoms are emitted, are determined using the Monte Carlo method. Further, the trajectories of particles in a sputter equipment are calculated under the assumption that the energy of emitted particles are determined using the Thompson's equation, and that the emission angular distribution is proportional to "sin θ cos θ". Still further, the collisions of particles are assumed elastic while assuming that the collision cross-section is constant. Still further, the collision points are determined using random numbers from Poisson's distribution. The trajectories thus determined are successively directed to each of plural coordinate points for calculating sputter deposition while checking to determine if the trajectory is shadowed.

However, according to the above mentioned conventional technique, the shadow judgment is implemented only on an uppermost portion of the sputter deposition. Thus, in the case where the deposited film is thick and the film deposition grows laterally from the side wall of the contact hole, the conventional technique has encountered the drawback that the shadow judgment is not precisely implemented.

SUMMARY OF THE INVENTION

It is therefore an object of the present to provide a method of precisely simulating a profile of sputter deposition for covering a contact hole formed on a semiconductor wafer.

In brief, these objects are achieved by a technique wherein, in order to simulate, using a computer, a profile of sputter deposition on a contact hole formed on a semiconductor wafer, a plurality of trajectories of particles emitted from a sputter target are calculated. One of the trajectories is directed to a first coordinate point which is included in the profile of sputter deposition and with which an amount of sputter deposition is calculated. Thereafter, a plurality of shadow judgment planes are successively defined with respect to all coordinate points, after which a check is made to determine if the above mentioned one of the plurality of trajectories is shadowed by each of said plurality of shadow judgment planes.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

A first embodiment of the present invention will be described with reference to FIGS. 1, 2A, and 2B.

Figure 1:
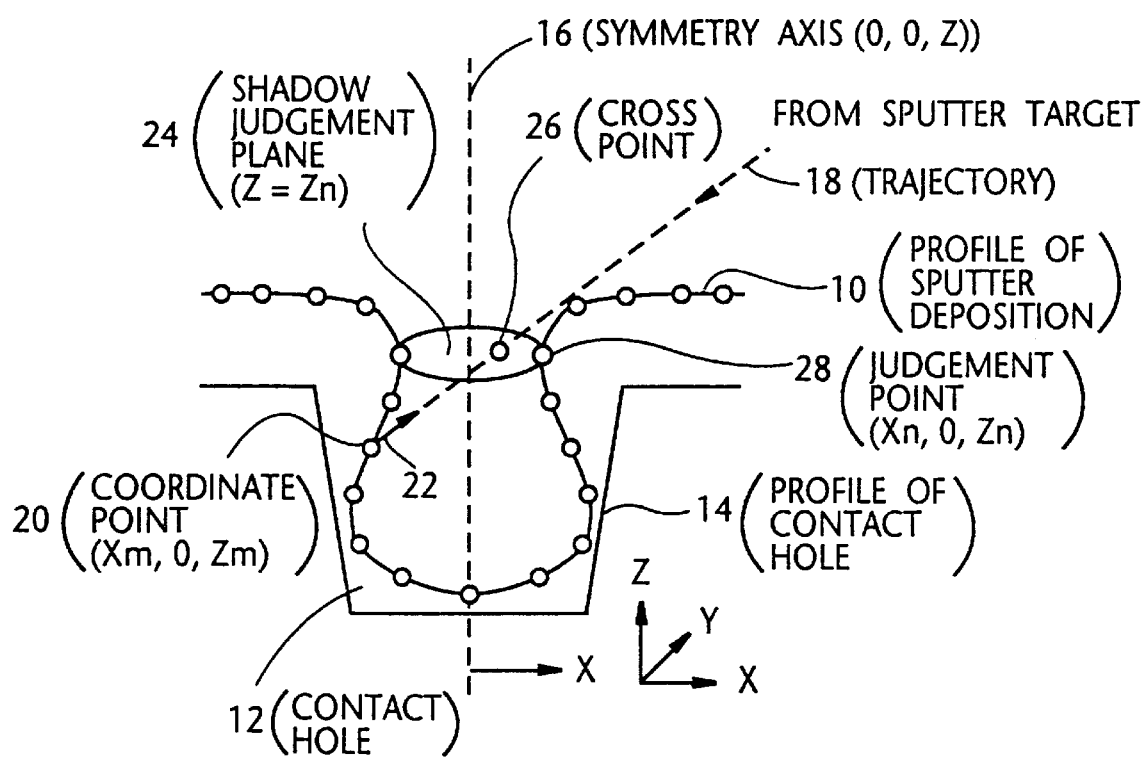
FIG. 1 is a diagram showing a simulated profile of sputter deposition for covering a contact hole according to a first embodiment of the present invention.

FIG. 1 is a cross-sectional view which shows a profile 10 of sputter deposition for covering a contact hole 12 whose profile is denoted by numeral 14. The contact hole 12 is symmetrical with respect to an axis and thus, this axis is named as a symmetry axis 16. A plurality of trajectories of particles (viz., atoms), emitted from a target, are calculated using the Monte Carlo method according to a conventional technique. More specifically, when calculating the trajectories, the distribution of particle emission angles (θ) is assumed as being equal to $2\pi \sin\theta \cos\theta$. Further, the collisions of particles with surrounding gases are estimated such that the elastic scattering of the emitted particles at a central force field is determined using the hard sphere approximation.

As shown in FIG. 1, the cross-section is defined by a plane that includes the symmetry axis 16. The profile of the contact hole 12 is modeled by string data comprised of a plurality of coordinate points (not shown), which respectively correspond to coordinate points (denoted by circles) on the sputter deposition profile 10.

As mentioned later, a plurality of the trajectories are successively selected and a selected one is directed to one coordinate point which, in FIG. 1, is denoted by numeral 20 and which is represented by (Xm,0,Zm). Further, a plurality of shadow judgment planes (only one is shown by numeral 24) are determined. A cross point 26 of the trajectory 18 with the plane 24 is calculated, after which a check is made to determine if the trajectory 18 is shadowed. In the case where the trajectory 18 is shadowed, this trajectory is neglected. Thereafter, an amount of film deposition at the coordinate is calculated and then, a new coordinate point is determined as schematically shown by an arrow 22.

Figure 2A:
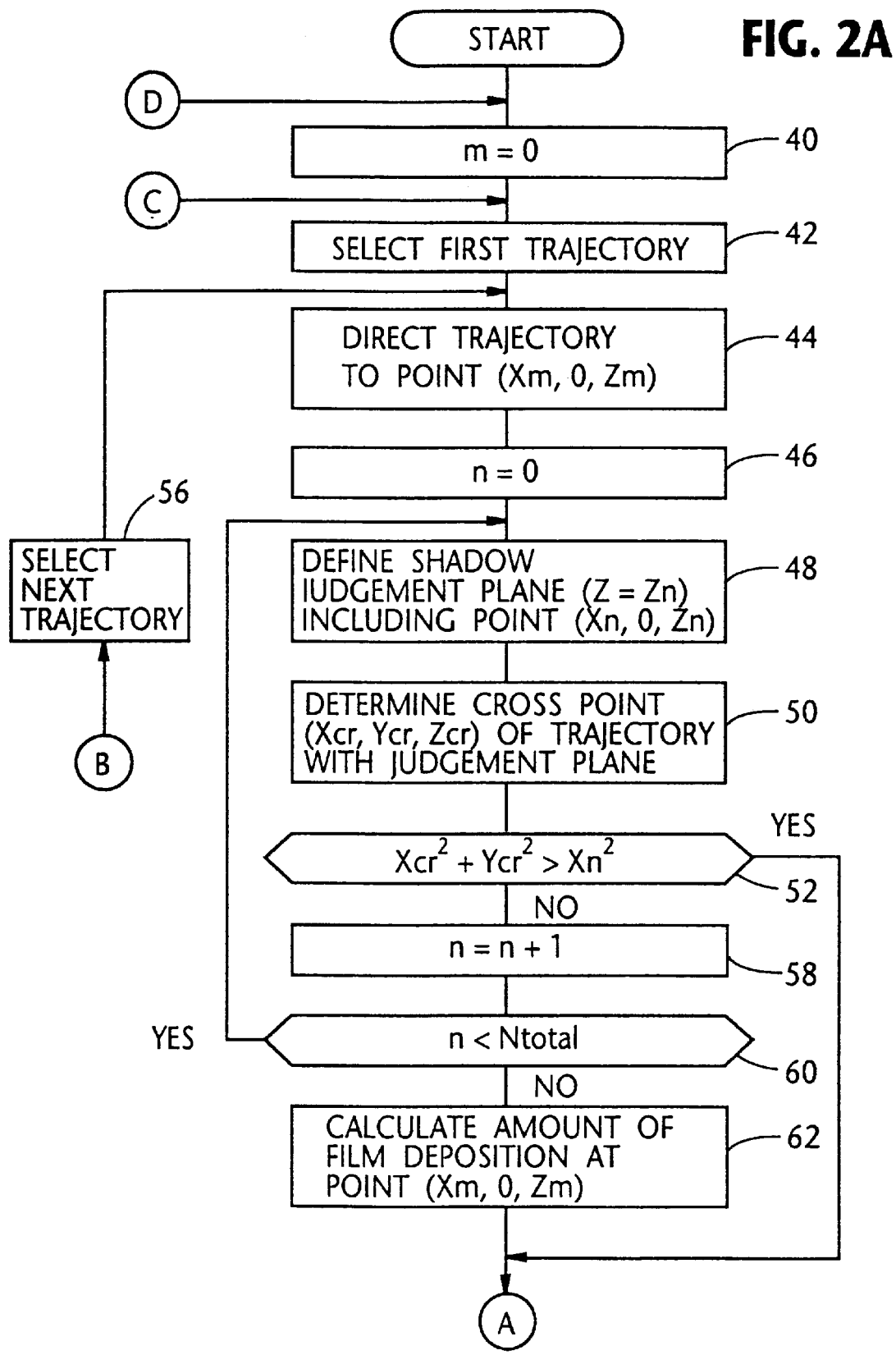
FIGS. 2A and 2B are each a flow chart which shows the steps which characterize the computer simulation depicted in FIG. 1.
Figure 2B:
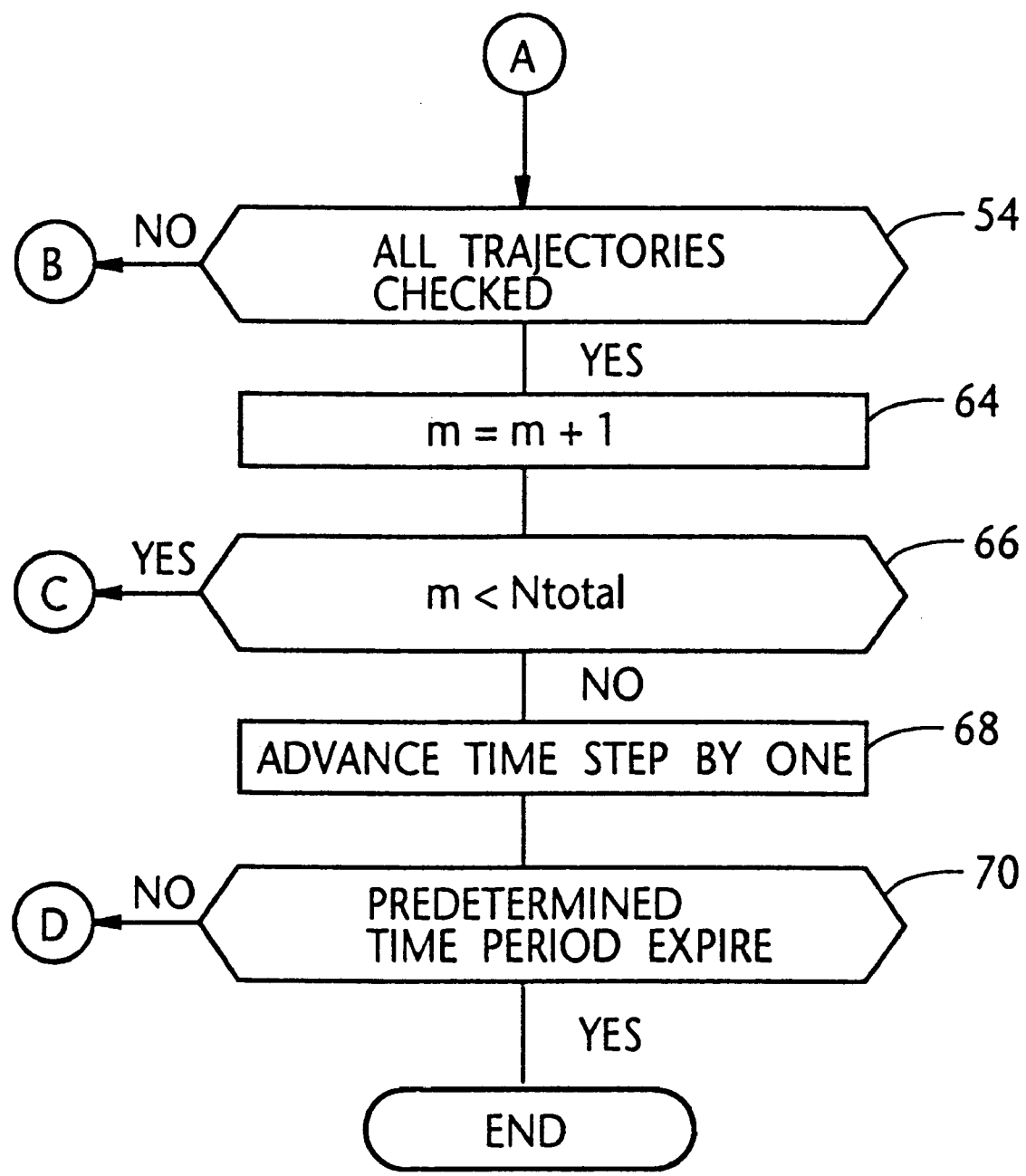

Referring to FIGS. 2A and 2B, the first embodiment will further be described.

At step 40, the coordinate number "m" is set to zero (m=0). At step 42, a first trajectory is selected from among a plurality of the trajectories obtained using the Monte Carlo method as mentioned above. Thereafter, at step 44, the first trajectory is directed to a coordinate point which is assumed as the point 20 (Xm, 1, Zm) in FIG. 1 for the sake of convenience of description. As mentioned above, the coordinate point (Xm, 0, Zm) is on the plane which is defined by Y=0. The symmetry axis 16 of the contact hole 12 is defined by a coordinate (0,0,Z).

According to the present invention, the shadow effects are checked with respect to all the coordinate points that define the film deposition profile. Therefore, at step 46, the coordinate number "n" is set to zero (n=0). Subsequently, the coordinate point 28 (Xn,0,Zn) (n=1 at the present stage) is selected which is used to define a shadow judgment plane (Z=Zn). That is, at step 50, a cross point (Xcr,Ycr,Zcr) of the trajectory 18 with the Z=Zn plane is calculated, after which a check is made to determine if (Xcr$^2$+Ycr$^2$) exceeds Xn$^2$ at step 52.

If the answer to the inquiry made at step 52 is affirmative, it is understood that the shadow effect is present (viz., the trajectory 18 is blocked). In this instance, the program goes to step 54 whereat a check is made to determine if all trajectories are checked (or selected). At this time, the answer to this inquiry is NO and thus, the routine flows to step 56 whereat the next trajectory is selected and the routine proceeds to step 44.

On the contrary, if the answer to the inquiry made at step 52 is negative (viz., NO), the routine goes to step 58 whereat "n" is incremented by one (n=n+1). Following this, at step 60, a check is made to determine if "n" is below the number of total coordinate points (Ntotal). Since n<Ntotal at this time, the routine returns back to step 48.

When it is determined at step 60 that "n" equals or exceeds Ntotal, the routine goes to step 62 whereat the amount (viz., thickness) of film deposition at the coordinate point (Xm,0,Zm) is calculated. Subsequently, the program flows to step 54 (FIG. 2B) at which a check is made to determine if all the trajectories obtained using the Monte Carlo method have been selected. If the answer at step 54 is YES, "m" is incremented by one (m=m+1) at step 64. Thereafter, at step 66, if m<Ntotal, the program flows to step 42. Therefore, the above mentions operations are implemented with respect to the next coordinate (m=1). If "m" equals or exceeds Ntotal (viz., NO) at step 66, a time step is advanced by one at step 68. Subsequently, at step 70, a check is made to determine if a predetermined time period expires. This time period corresponds to a film deposition time which is previously determined before carrying out the aforesaid computer simulation. If the answer at step 70 is NO, the routine goes to step 40, and otherwise the program is terminated.

The inventor conducted a computer simulation wherein a 1 μm thick aluminum was deposited on a 1 μm wide 1 μm deep contact hole. The calculation was completed about 10 minutes using an engineering work station with processor speed of 130 MIPS (million instructions per second). The simulation error was about 10%.

Figure 3:
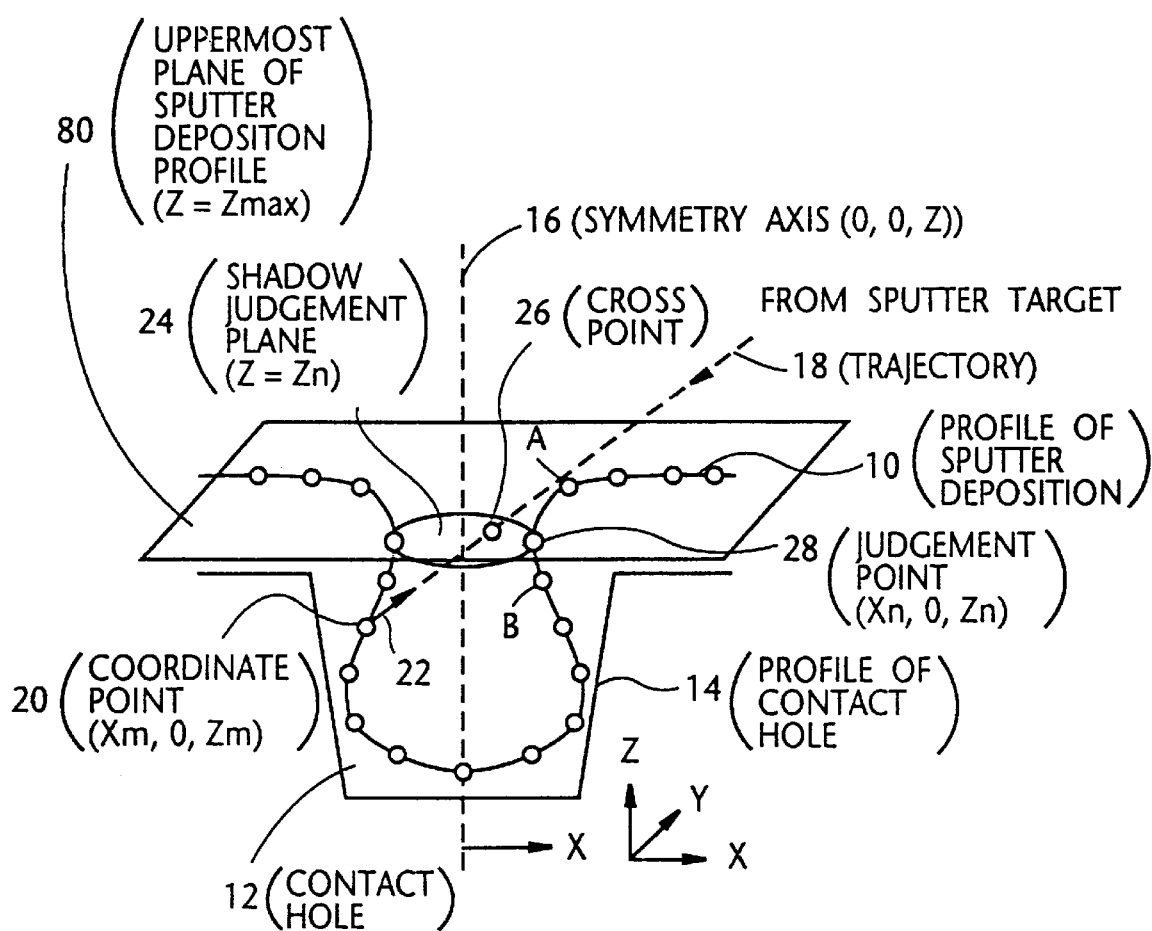
FIG. 3 is a diagram showing a simulated profile of sputter deposition for covering a contact hole according to a second embodiment of the present invention.
Figure 4A:
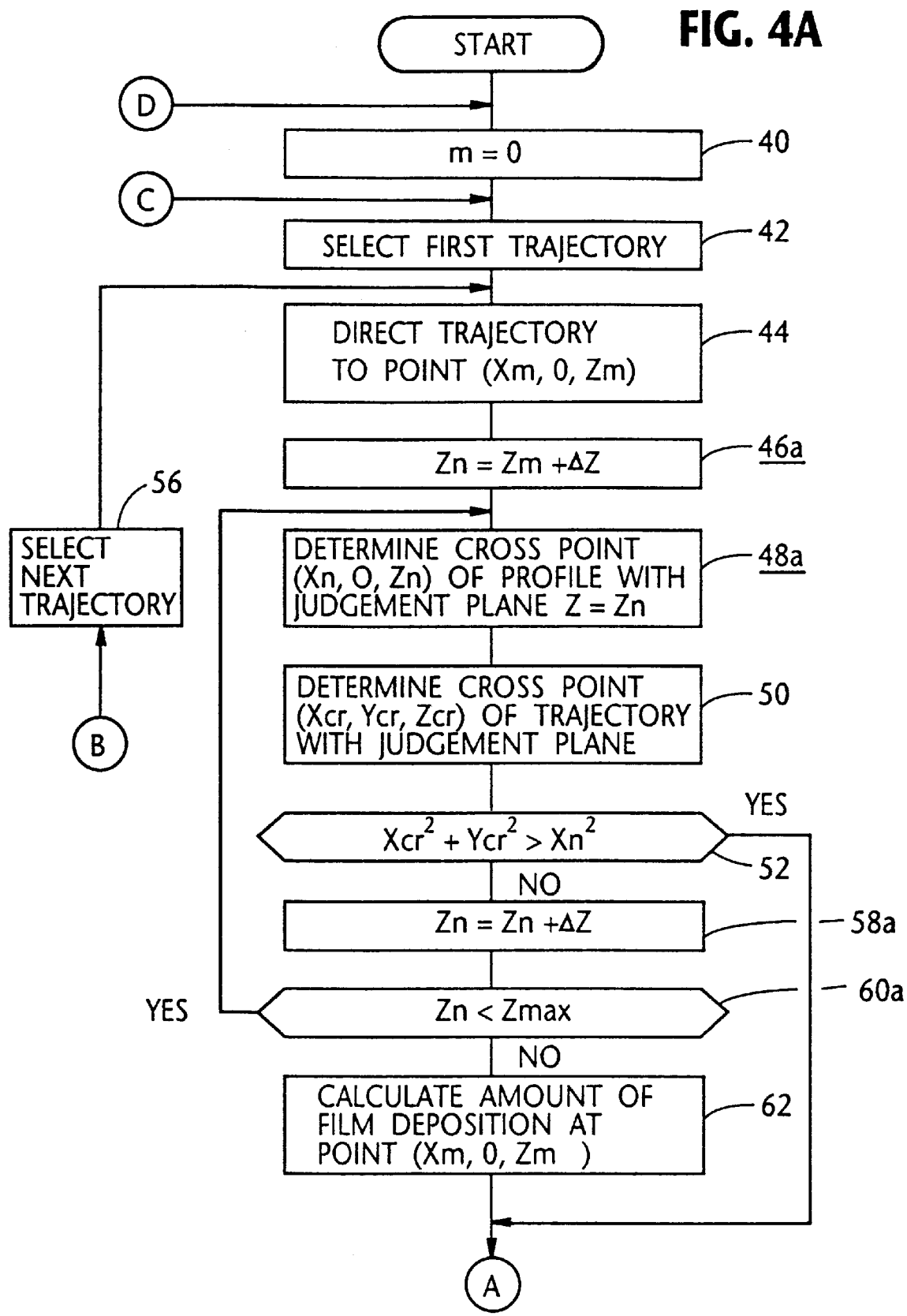
FIGS. 4A and 4B are each a flow chart which shows the steps which characterize the computer simulation depicted in FIG. 3.

A second embodiment of the present invention will be described with reference to FIGS. 3, 4A, and 4B.

According to the second embodiment, the shadow judgment planes are defined in a manner which is different from the first embodiment. Further, the second embodiment makes use of an uppermost plane 80 (Z=Zmax) (FIG. 3) of the sputter deposition profile 10 (FIG. 1). If a shadow judgment plane Zn exceeds the uppermost plane 80 (viz., Zmax), the amount of film deposition is calculated as mentioned later. Other than this, the second embodiment is substantially identical with the first one.

The second embodiment is further described with reference to FIG. 4A. Comparing FIGS. 2A and 4A, FIG. 4A includes steps 46a, 48a, 58a, and 60a in lieu of steps 46, 48, 58, and 60, respectively. The remaining steps of FIG. 2A are identical to the corresponding steps of FIG. 4A.

At step 46a, ΔZ is added to the value on the Z-axis of the coordinate point (Xm,0,Zm) where film growth is to be calculated. Thus, a shadow judgment plane (Z=Zn) is defined. ΔZ indicates a value which approximately corresponds to a difference between two adjacent Z-axis values. At step 48a, a cross point (Xn,0,Zn) of the shadow judgment plane (Z=Zn) with the sputter deposition profile 10 is determined by way of linear interpolation between two neighboring coordinate points A and B. Following this, at step 50, as mentioned above, a cross point (Xcr,Ycr,Zcr) of the trajectory 18 with the Z=Zn plane is calculated. After implementing the conditional step 52, the shadow judgment plane Zn is increased by ΔZ, after which a check is made to determine if Zn<Zmax at step 60a. If the answer at step 60a is YES, the routine goes back to step 48a. Otherwise (viz., NO), the routine flows to step 62.

Figure 4B:
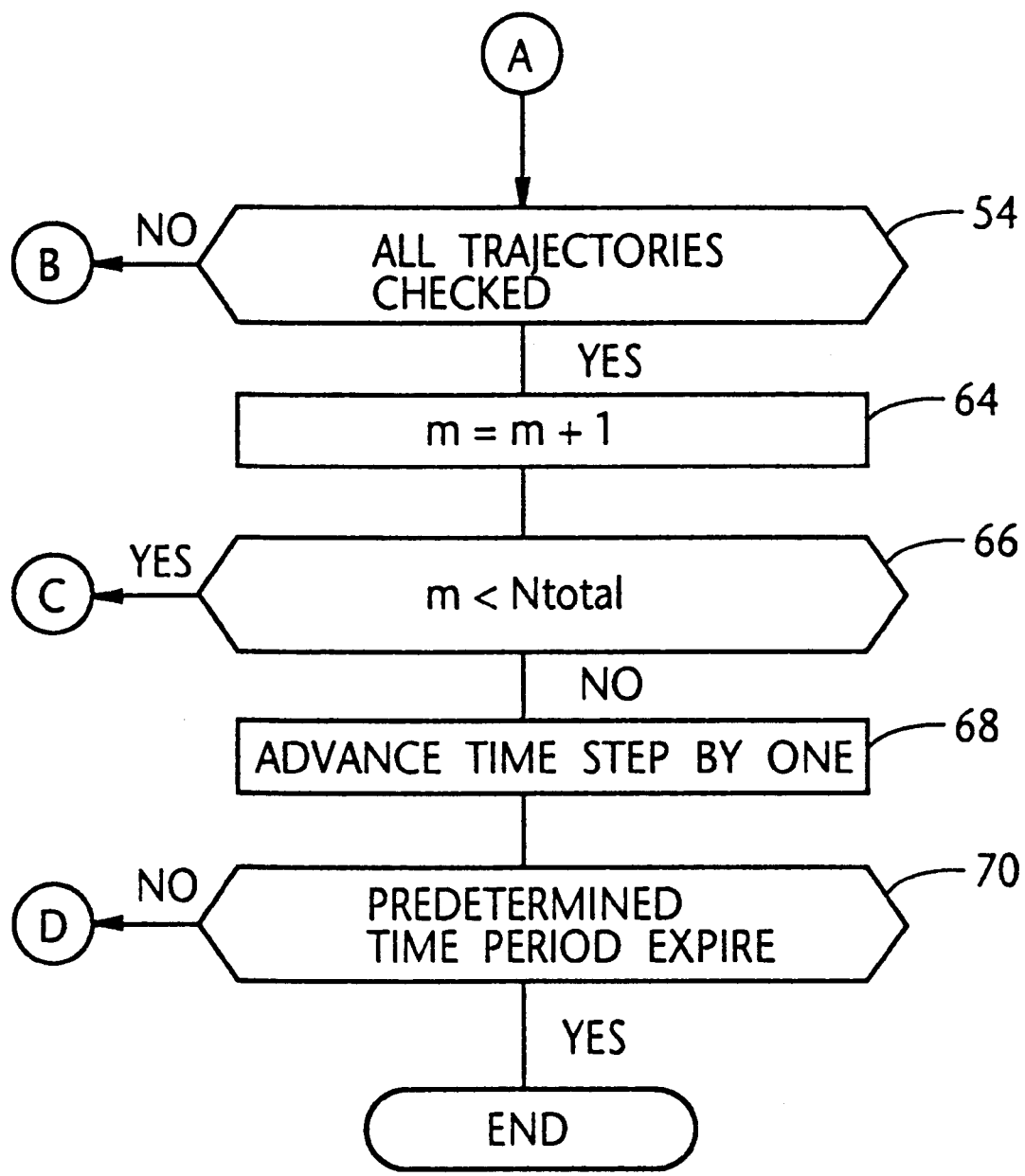

FIG. 4B is exactly identical with FIG. 2B and thus, further description thereof is omitted for brevity. The second embodiment is advantageous over the first embodiment in terms of calculation errors.

It will be understood that the above disclosure is representative of only two possible embodiments of the present invention and that the concept on which the invention is based is not specifically limited thereto.

What is claimed is:

1. A method of simulating, using a computer, a profile of sputter deposition on a contact hole formed on a semiconductor wafer, said method comprising the steps of:

(a) calculating a plurality of trajectories of particles emitted from a sputter target;

(b) directing one of said plurality of trajectories to a first coordinate point which is included in said profile of sputter deposition and with which an amount of sputter deposition is calculated; and (c) defining successively a plurality of shadow judgment planes with respect to all coordinate points included in said profile of sputter deposition, and successively checking to determine if said one of said plurality of trajectories crosses each of said plurality of shadow judgment planes.

2. The method as claimed in claim 1, wherein the plurality of trajectories of particles are calculated using a Monte Carlo method.

3. The method as claimed in claim 1, wherein the semiconductor wafer is made of silicon, and the sputter target is made of aluminum.

4. The method as claimed in claim 1, wherein the distribution of particle emission angles (θ) is assumed as being equal to 2π sin θ cos θ and wherein the collisions of the particles with surrounding gases are estimated such that elastic scattering of the emitted particles at a central force field is determined using a hard sphere approximation.

5. A method of simulating, using a computer, a profile of sputter deposition on a contact hole in a semiconductor wafer, said method comprising the steps of:

(a) calculating a plurality of trajectories of particles emitted from a sputter target;

(b) directing one of the plurality of trajectories to a first coordinate point which is included in the profile of sputter deposition and with which an amount of sputter deposition is to be calculated; and (c) defining successively a plurality of shadow judgment planes with an interval whose value approximately corresponds to a difference between two adjacent coordinate points included in the profile of sputter deposition, and successively checking to determine if the one of the plurality of trajectories crosses each of the plurality of shadow judgment planes.

6. The method as claimed in claim 5, wherein the plurality of trajectories of particles are calculated using a Monte Carlo method.

7. The method as claimed in claim 5, wherein the semiconductor wafer is made of silicon, and said sputter target is made of aluminum.

8. The method as claimed in claim 5, wherein the distribution of particle emission angles ($\theta$) is assumed as being equal to $2\pi \sin \theta \cos \theta$ and wherein the collisions of the particles with surrounding gases are estimated such that elastic scattering of the emitted particles at a central force field is determined using a hard sphere approximation.

9. A method of simulating a sputter deposition profile on a wall of a hole in a semiconductor device, comprising the steps of:

determining coordinates of each of a plurality of coordinate points of a sputter deposition profile on a wall of a hole in a semiconductor device;

defining a plurality of parallel shadow judgment planes along an axial length of the hole that are each perpendicular to an axis of the hole and that each have a periphery defined by the sputter deposition profile;

calculating a plurality of trajectories of sputter particles from a sputter target to the coordinate points; and determining whether each of the plurality of trajectories crosses each of the plural shadow judgment planes that are between the sputter target and a respective one of the coordinate points, wherein a one of the trajectories that does not cross each of the shadow judgment planes between the sputter target and a respective one of the coordinate points does not contribute to sputter deposition at the respective one coordinate point.

* * * * *